(12) United States Patent
Osari

(10) Patent No.: US 6,417,086 B1
(45) Date of Patent: Jul. 9, 2002

(54) METHOD OF MANUFACTURING SEMICONDUCTOR DEVICE HAVING NONVOLATILE MEMORY AND LOGIC CIRCUIT USING MULTI-LAYERED, INORGANIC MASK

(75) Inventor: Kanji Osari, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/506,379

(22) Filed: Feb. 18, 2000

(30) Foreign Application Priority Data

Feb. 22, 1999 (JP) .......................................... 11-043888

(51) Int. Cl.[7] ................. H01L 21/3205; H01L 21/4763; H01L 21/336
(52) U.S. Cl. ........................ 438/594; 438/263; 438/950
(58) Field of Search ................................. 438/263, 594, 438/950

(56) References Cited

U.S. PATENT DOCUMENTS 5,994,733 A  * 11/1999  Nishioka et al. ............ 257/316

FOREIGN PATENT DOCUMENTS

| JP | 09321052 | 12/1997 |
| JP | 10056080 | 2/1998 |
| JP | 10-189922 A | * 7/1998 |

* cited by examiner

Primary Examiner—Howard Weiss
(74) Attorney, Agent, or Firm—Finnegan, Henderson, Farabow, Garrett & Dunner, L.L.P.

(57) ABSTRACT

An inorganic film with a double-layers structure is used as an etching mask in an EEPROM area to pattern a double-layers gate, while a thin inorganic film obtained by removing one layer of the double-layers inorganic film by etching is used as an etching mask in a CMOS logic circuit area. Therefore, the gate pattern can be formed with high precision by using a thin etching mask in the CMOS logic circuit area.

11 Claims, 14 Drawing Sheets

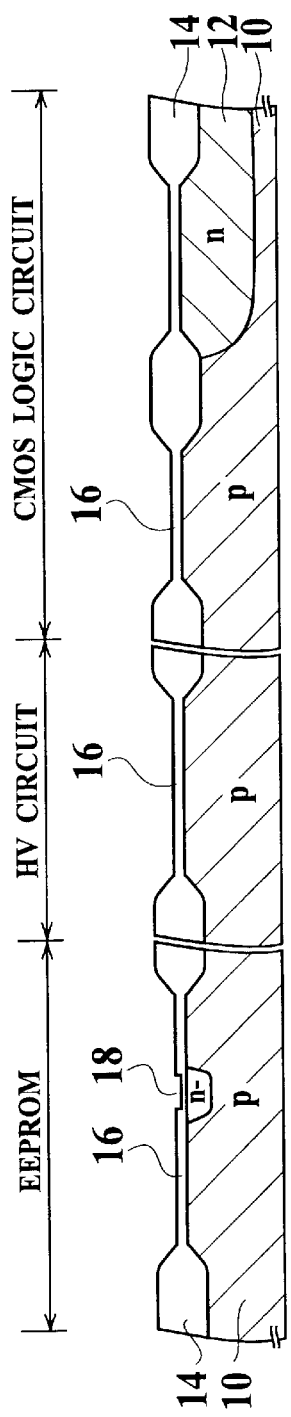
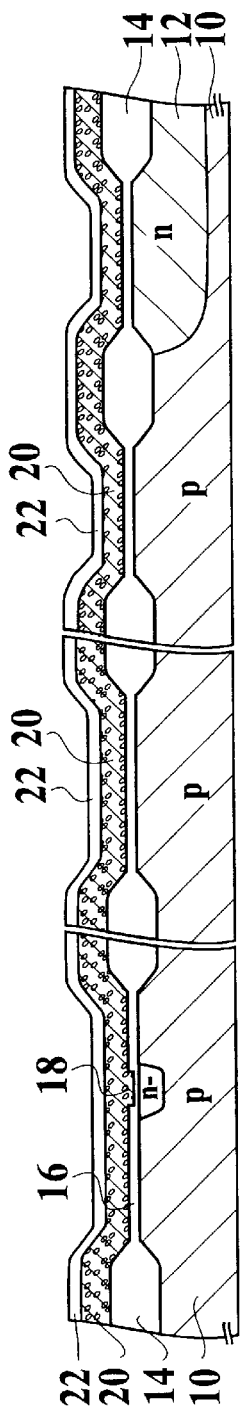
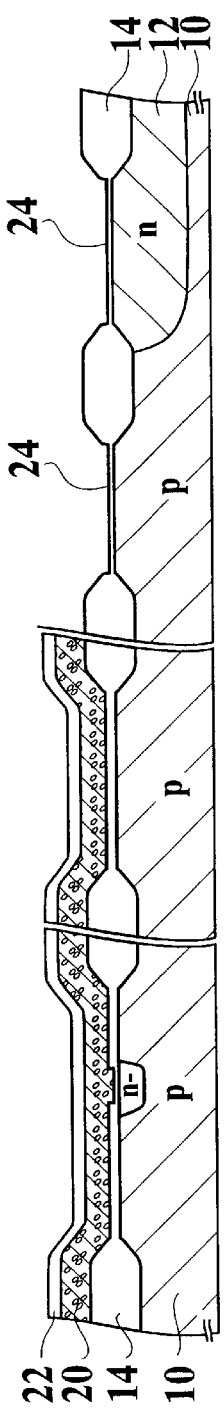
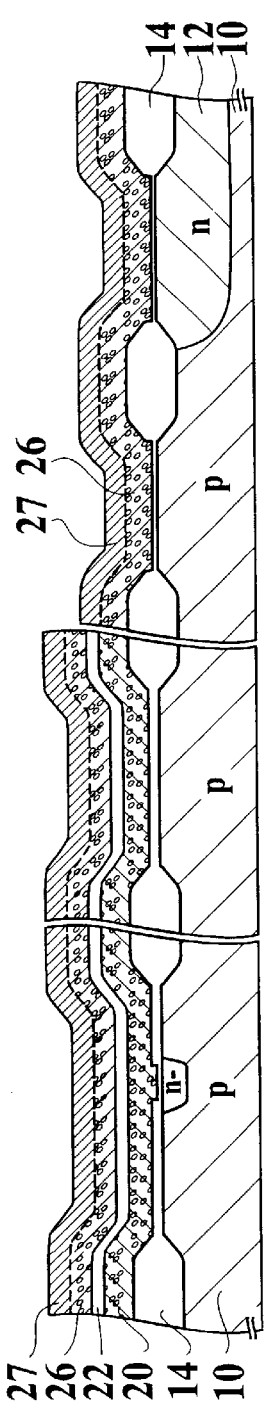
FIG.2A
FIG.2B
FIG.2C
FIG.2D

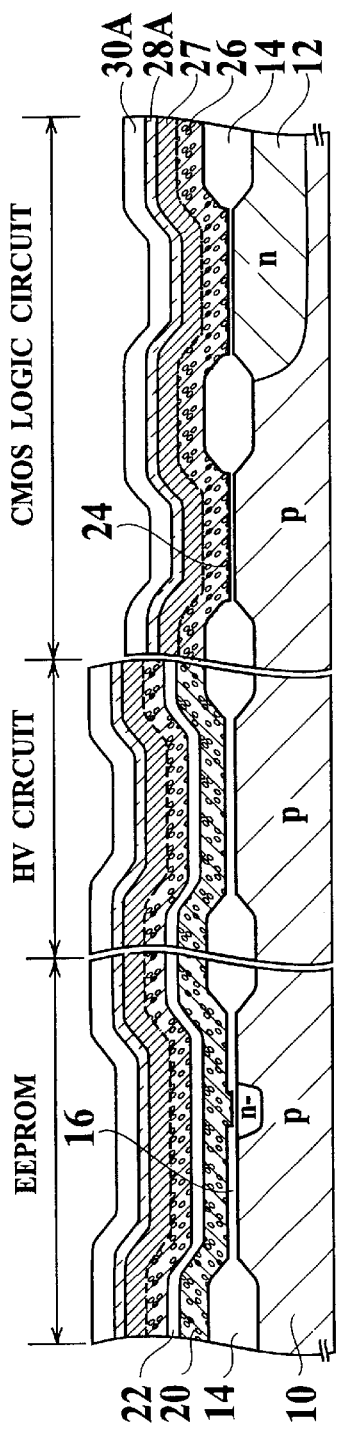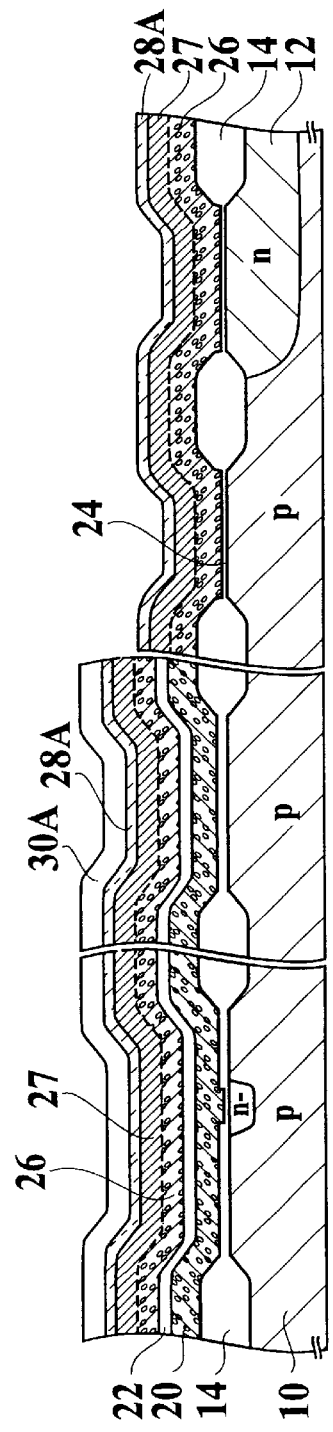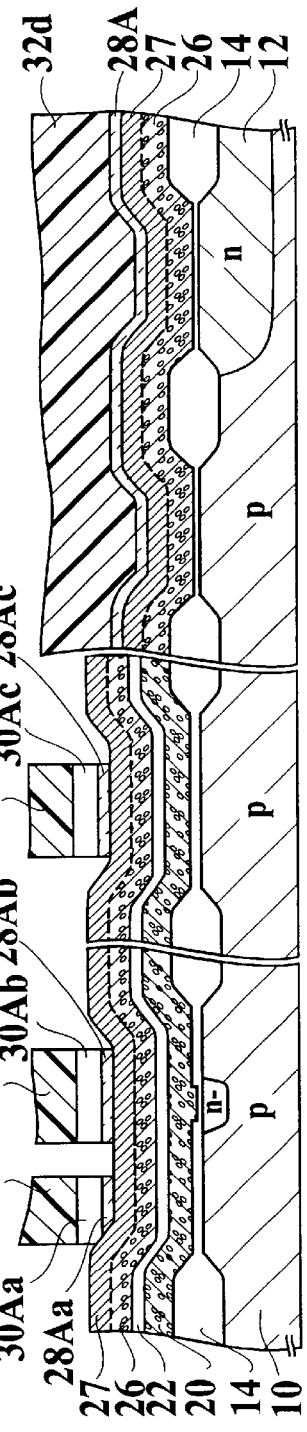

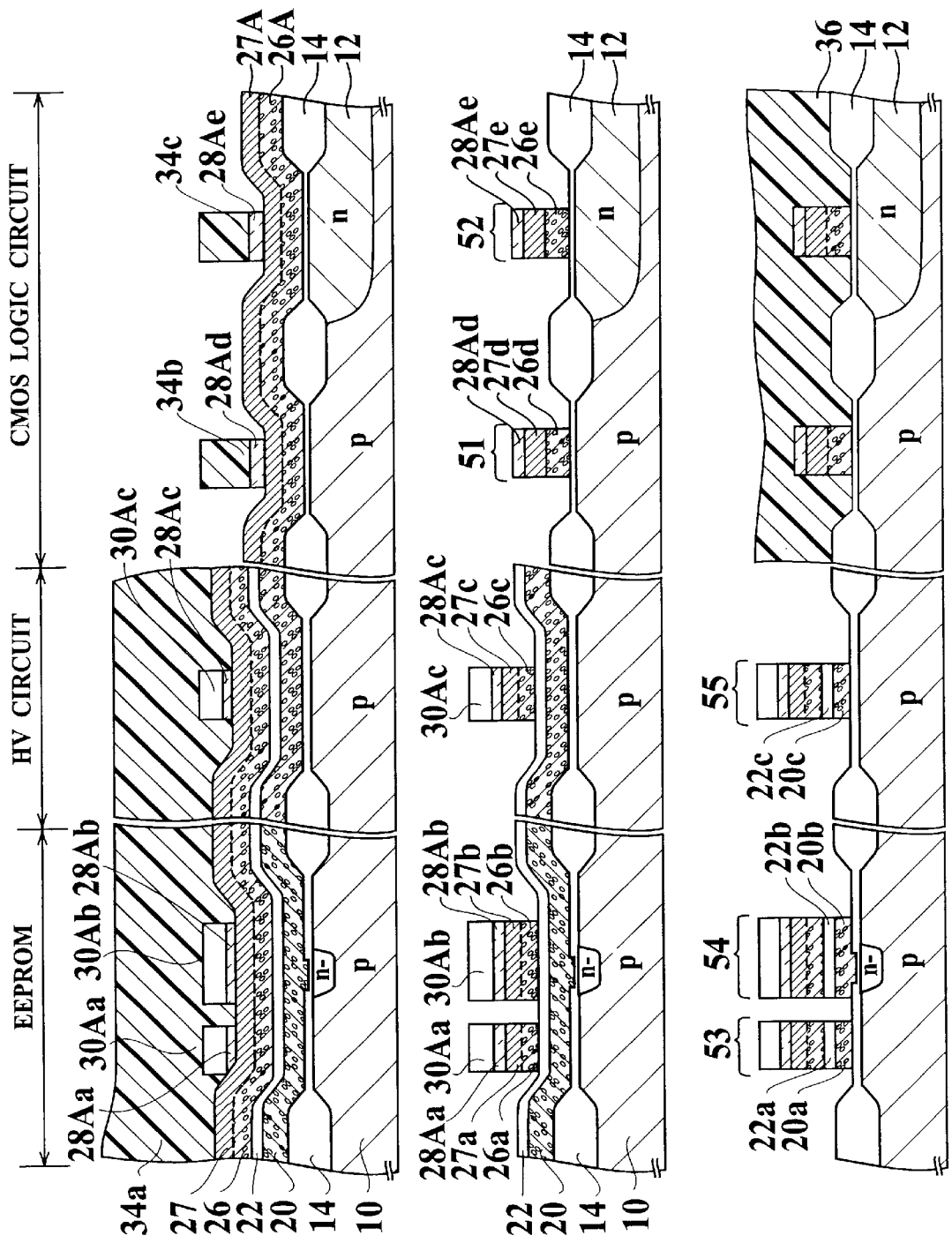

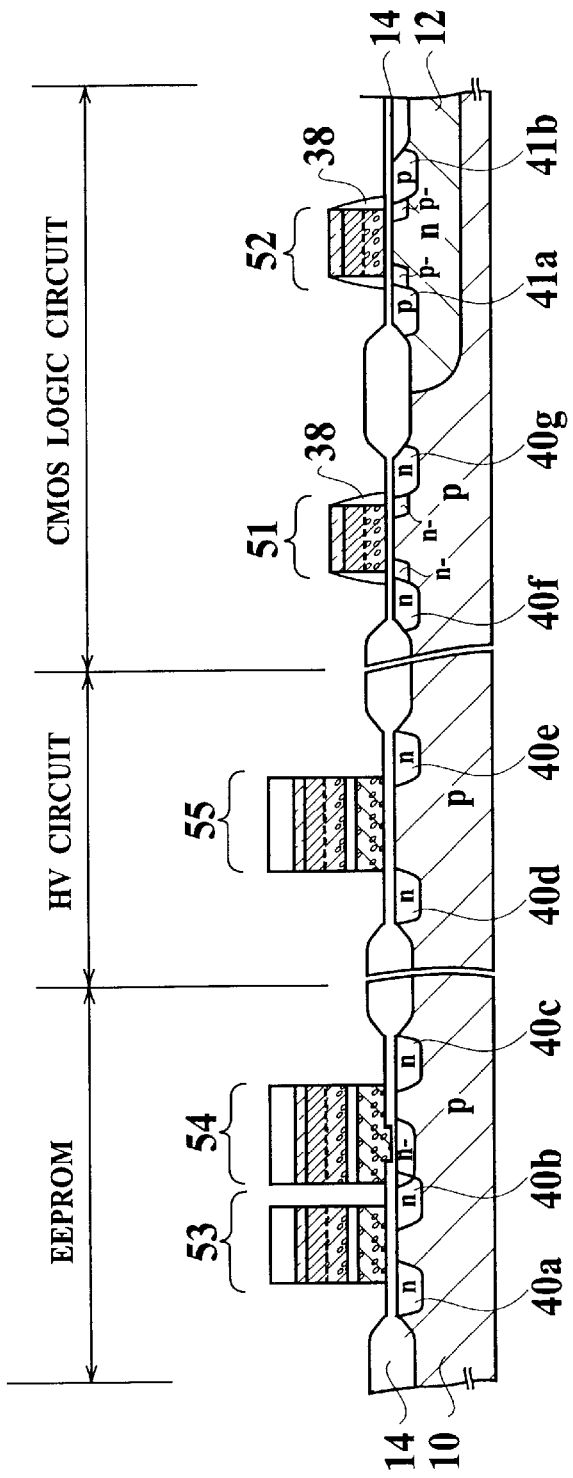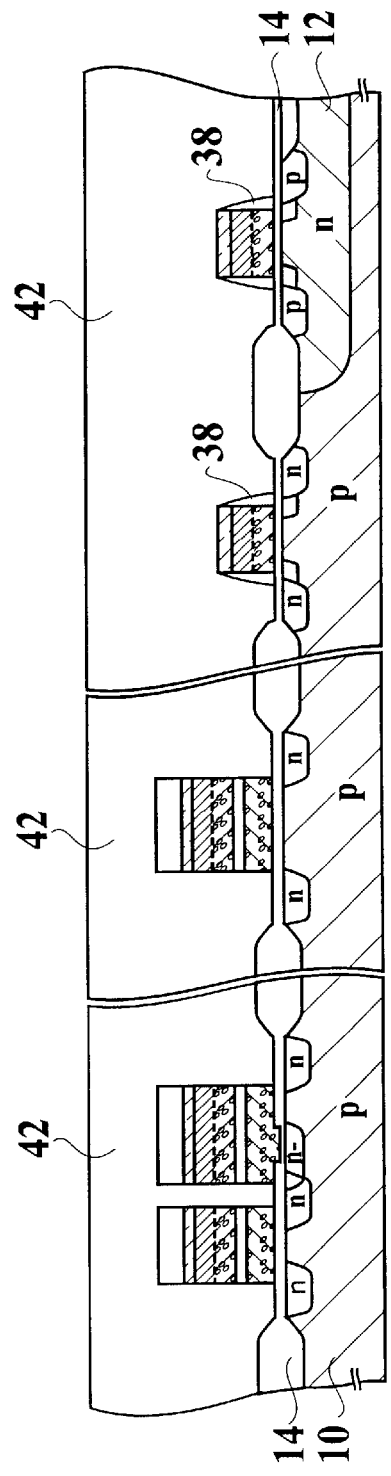
FIG.5K
FIG.5L

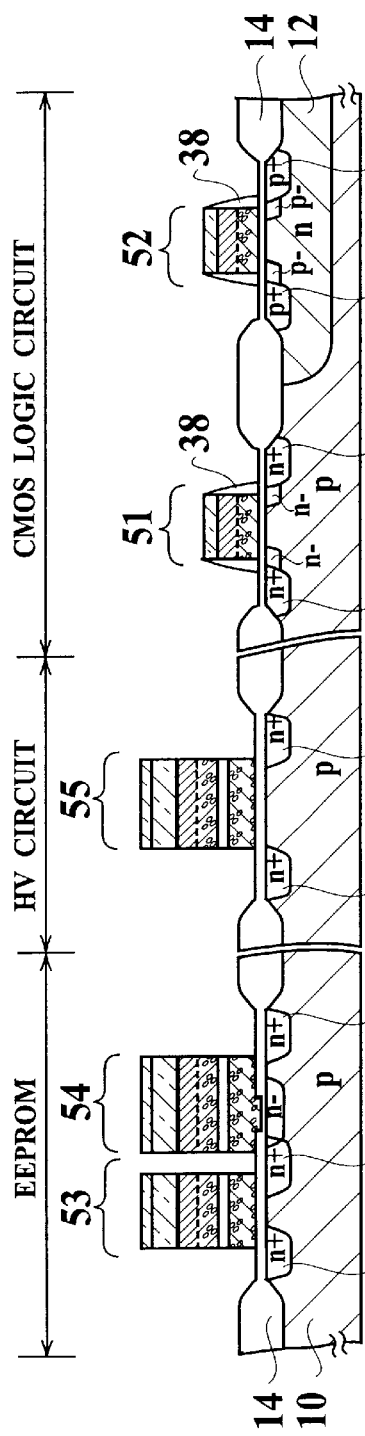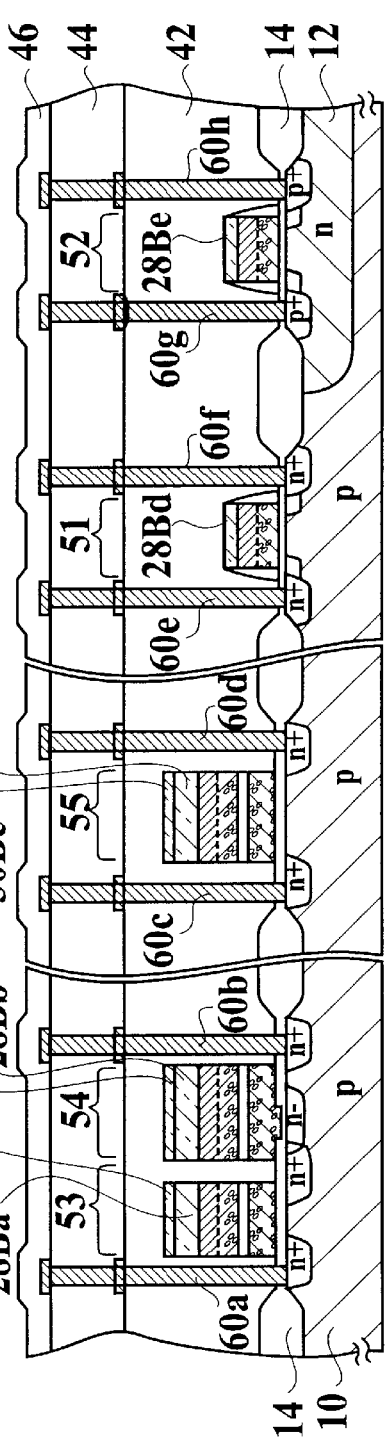

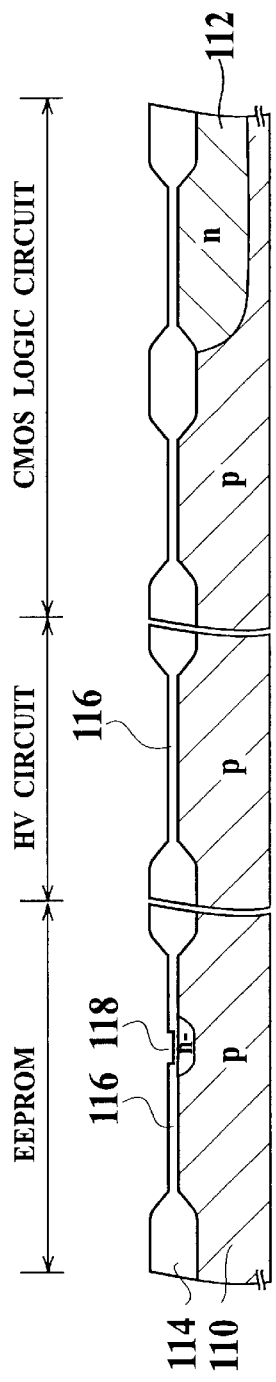
FIG.13A *PRIOR ART*
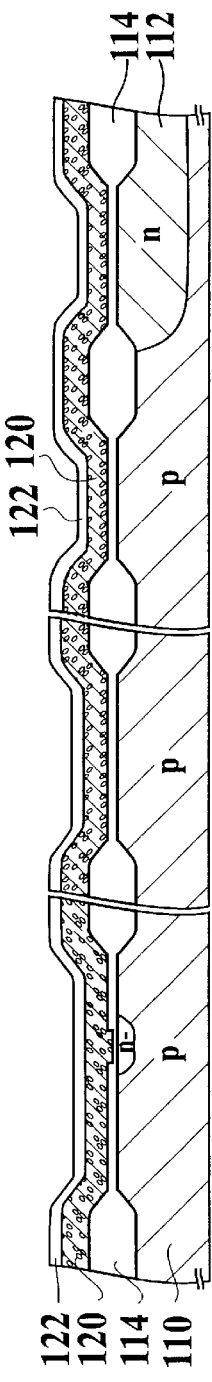
FIG.13B *PRIOR ART*
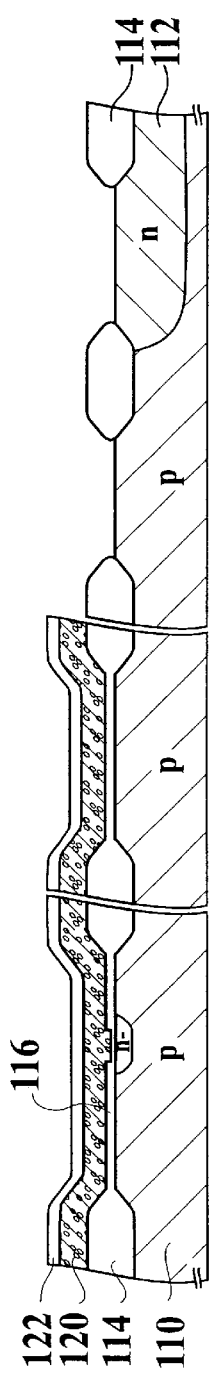
FIG.13C *PRIOR ART*
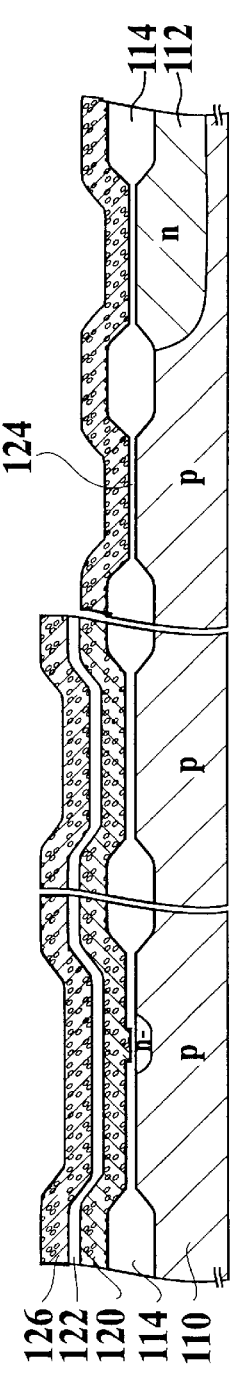
FIG.13D *PRIOR ART*

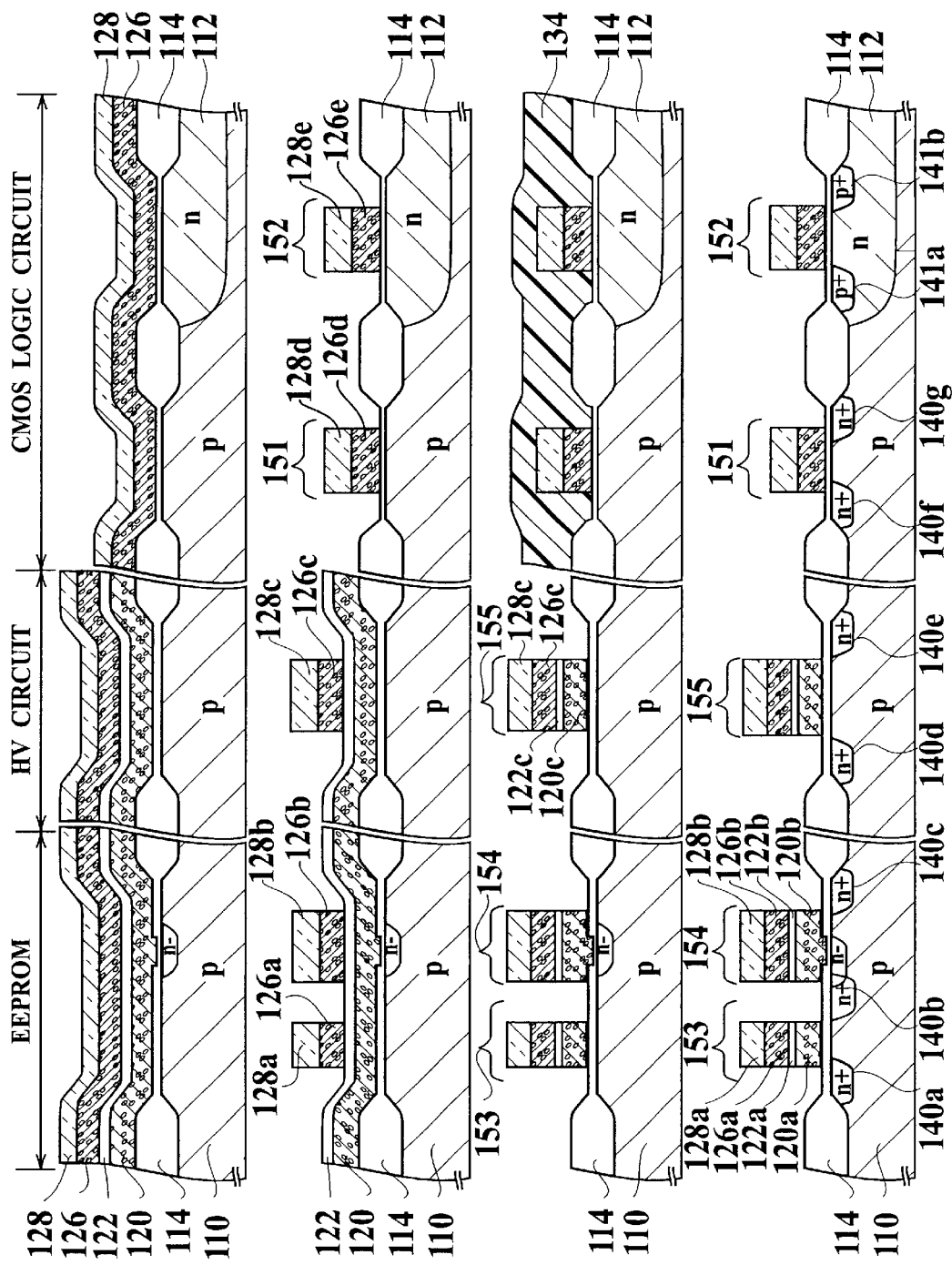

METHOD OF MANUFACTURING SEMICONDUCTOR DEVICE HAVING NONVOLATILE MEMORY AND LOGIC CIRCUIT USING MULTI-LAYERED, INORGANIC MASK

BACKGROUND OF THE INVENTION

1. Field of the Invention

The present invention relates to a semiconductor device having a nonvolatile memory and a logic circuit and, more particularly, an integrated circuit device having a double-layers gate structure and a single-layer gate structure and a method of manufacturing the same.

2. Description of the Related Art

In recent years, an integrated circuit semiconductor device has been utilized in various fields including various information devices such as a mobile device, an IC card, etc. In such semiconductor device, a nonvolatile memory such as EEPROM (Electrically Erasable Programmable ROM), etc., from/into which the user can electrically erase/program data, and a CMOS logic circuit such as ASIC (Application Specific Integrated Circuit), etc. are integrated on the same chip.

FIG. 12 is a sectional view showing a structure of a semiconductor device having the EEPROM and the CMOS logic circuit in the prior art. As shown in FIG. 12, a high voltage operating circuit (HV circuit), which is operated by a high voltage such as about 20 V necessary for erasing/programming of a memory cell, is installed in the neighborhood of the EEPROM.

As shown in FIG. 12, each memory cell of the EEPROM is composed of a memory transistor and a selector transistor connected in series with this memory transistor. The memory transistor is constructed as a double-layers gate which consists of an underlying gate oxide film 116 having a thin tunnel oxide film 118 in its partial area, a floating gate 120b, an interlayer gate oxide film 122, and a control gate 126b.

When the voltage is applied to the control gate 126b, the tunnel current is generated via the tunnel oxide film 118 to inject/extract electrons into/from the floating gate 120b. Binary digits "1", "0" are decided based on whether or not the storage charge exists in the floating gate 120b. Since the memory transistor is isolated from the periphery, the memory transistor can still hold the storage charge after the power supply is turned off if the charge is accumulated in the memory transistor once.

Basically the selector transistor, the transistor in the HV circuit, and the CMOS transistor in the logic circuit other than the memory transistor are formed as a single-layer gate. In many cases, in order to achieve the process matching, these transistors are formed as the double-layers gate structure to mate with the structure of the memory transistor, and a structure in which overlying and underlying gate electrodes are short-circuited partially is used.

In the double-layers gate structure, a thickness of the layer to be etched by the dry etching becomes considerably large in forming gate patterns rather than the case where the single-layer gate structure is formed. Since a time required for the etching is increased longer as the to-be-etched layer becomes thicker, the used etching mask is requested to achieve the high etching resistance. In addition, since a surface of the etching mask is also etched at the time of etching, the predetermined thickness or more is needed for the etching mask.

For example, if a resist mask is used as the etching mask, a necessary mask thickness becomes considerably large because the resist is ready to be etched. Also, since the resist is gasified during the etching process to generate new reaction adhesive, drip or deformation of the mask pattern is caused. Therefore, in forming the double-layers gate pattern, normally an inorganic film such as an SiNx film is utilized in place of the resist mask. The inorganic film mask is normally called a hard mask.

However, since a thickness of the to-be-etched layer is still considerably thick in the double-layers gate structure even if the hard mask is used, it is essentially difficult to form the fine pattern. Therefore, like the LSI for the IC card including the nonvolatile memory, if the CMOS logic circuit which is integrated together with the EEPROM on the same chip are requested to be formed as the fine patterns, as shown in FIG. 12, the double-layers gate structure is formed in the EEPROM area regardless of the burden of the process, nevertheless the single-layer gate structure is formed in the CMOS logic circuit area.

As a result, a structure which consists of the logic circuit with the single-layer gate structure and the memory cell and its peripheral circuit with the double-layers gate structure is formed on the same chip.

A method of manufacturing a LSI including the EEPROM and including the single-layer gate structure and the double-layers gate structure in the prior art will be explained with reference to FIG. 13A to FIG. 14H hereunder.

First, as shown in FIG. 13A, an n well 112 is formed in a part of the CMOS logic circuit area on a p-type semiconductor substrate 110. Then, respective circuit areas are defined by a field oxide film 114 in the LOCOS step so as to electrically isolate respective circuit areas.

Then, an n-type shallow impurity diffusion area is formed under a tunnel oxide film area of the EEPROM cell. Also, a silicon oxide film (SiO2) 116 of about 350 Å thickness is formed as a gate oxide film on a surface of the substrate. The gate oxide film 116 is removed from a tunnel oxide film forming area by the etching, and then a tunnel oxide film 118 made of a thin SiO2 film of about 90 Å thickness is formed in this area.

Then, as shown in FIG. 13B, a first polysilicon film 120 is formed. Phosphorus (P) is doped into this film to reduce the resistance value, as occasion demands. Then, a so-called ONO (oxide/nitride/oxide) film 122 serving as an interlayer gate insulating film is formed. This ONO film 122 is formed of three layers which consists of a SiO2 film obtained by thermally oxidizing a surface of the first polysilicon film 120, a SiNx film formed by the CVD method, and an SiO2 film obtained by oxidizing a surface of the SiNx film.

Then, as shown in FIG. 13C, the ONO film 122, the first polysilicon film 120, and the gate oxide film 116 formed thereunder are removed by the etching from the CMOS logic circuit area in which the single-layer gate structure is to be formed.

Then, as shown in FIG. 13D, in the CMOS logic circuit area, a thin gate oxide film 124 is formed to mate with a size of a fine transistor to be formed in this area. After this, a second polysilicon film 126 is formed on an overall surface of the substrate. Ions are implanted into a channel area in the logic circuit area to control a threshold value of the transistor, as occasion demands, and thus the impurity concentration is adjusted previously.

Then, as shown in FIG. 14E, an SiNx film 128 used as a hard mask is formed on an overall surface of the substrate. Since this SiNx film 128 is used as an etching mask in forming the double-layers gate pattern in the EEPROM area, normally such SiNx film 128 must be formed to have a large thickness of 2000 Å or more.

Then, as shown in FIG. 14F, mask patterns 128a to 128e for respective gates are formed by selectively etching the SiNx film 128. Then, the second polysilicon film 126 is etched by the RIE (Reactive Ion Etching) method using the mask patterns as the etching mask. In the EEPROM area, a surface of the interlayer gate insulating film 122 is exposed because the second polysilicon film 126 is etched. In the CMOS logic circuit area, single-layer gates 151, 152 are formed.

In this manner, the single-layer gates which are formed in the CMOS logic circuit area are patterned simultaneously by using the thick hard mask which is used to form the double-layers gates.

Then, as shown in FIG. 14G, the CMOS logic circuit area is covered with a resist film 134. In the EEPROM area and the HV circuit area, the etching of the interlayer gate insulating film 122 and the first polysilicon film 120 is continued while using the mask patterns 128a to 128c. Thus, the double-layers gates 153, 154, 155 are obtained. Then, the resist film 134 for covering the CMOS logic circuit area is removed.

Then, the ion implantation is carried out while using the gates 151 to 155, on which the hard mask is still formed, as the ion-implantation mask and then the annealing step is performed, whereby n-type impurity diffusion areas 140a to 140g and p-type impurity diffusion areas 141a and 141b which constitute source/drain areas of respective transistors are formed.

Finally, leading electrodes 160a to 160h are formed to be extended from the interlayer insulating films 142, 144 and the source/ drain areas, and then a surface of a resultant structure is covered with a passivation film 146. As a result, a semiconductor device shown in FIG. 12 can be completed.

Since the SiNx etching mask used in patterning of the gates 151 to 155 is the insulating film, it can constitute a part of the interlayer insulating film 142. Thus, the mask is not removed and is left as it is after the steps have been finished.

As described above, in the method of manufacturing the semiconductor device having a double-layers gate structure and the single-layer gate structure in the prior art, the patterning of the double-layers gate and the single-layer gate is performed by using the hard mask which is formed by the same layer. More particularly, in the CMOS logic circuit area in which the formation of the fine pattern is demanded, the single-layer gate is formed by using as the etching mask the thick hard mask which has the etching resistance necessary for the formation of the double-layers gate.

However, the thicker the etching mask, the lower the dimensional precision of the mask pattern. Therefore, such a problem is pointed out that it is difficult to achieve the sufficient pattern precision in the logic circuit in which the formation of the fine gate pattern, e.g., the gate width of less than 0.3 μm, is requested, like the LSI for the IC card including the EEPROMS.

SUMMARY OF THE INVENTION

It is an object of the present invention to form a double-layers gate and a single-layer gate with appropriate pattern precision respectively, in a semiconductor device having a nonvolatile memory with a double-layers gate structure and a logic circuit with a single-layer gate structure.

According to an aspect of the present invention, there is provided a method of manufacturing a semiconductor device having a nonvolatile memory with a double-layers gate structure and a logic circuit with a single-layer gate structure, comprising the steps of patterning a double-layers gate by using an etching mask which consists of a plurality of layered inorganic films; and patterning a single-layer gate by using an etching mask which consists of any single-layer inorganic film of the plurality of layered inorganic films, According to this aspect, the thick etching mask consisting of a plurality of inorganic films which has the etching resistance can be used in patterning the double-layers gate. In contrast, the thin single-layer inorganic film which is suitable for the formation of the fine pattern can be used in patterning the single-layer gate.

In addition, the manufacturing method set forth in the following may be used. That is, a first gate insulating film, a first conductive film, and a second gate insulating film are layered in sequence on an overall area of a main surface of a substrate, then the first gate insulating film, the first conductive film, and the second gate insulating film in a logic circuit area are removed by etching, and then a third gate insulating film is formed on an exposed surface of the substrate in the logic circuit area. Then, a second conductive film is formed on the overall area of the main surface of the substrate, then a first inorganic film and a second inorganic film are layered on the second conductive film, and then the second inorganic film is removed in the logic circuit area by etching. After this, an etching mask for the double-layers gate is formed by etching selectively the first inorganic film and the second inorganic film in a memory cell area. In contrast, an etching mask for the single-layer gate is formed by etching selectively the first inorganic film in the logic circuit area. The single-layer gate structure is formed by etching the first conductive film in the logic circuit area by using the etching mask for the single-layer gate, whereas the double-layers gate structure is formed by etching selectively the second conductive film, the second gate insulating film, and the first conductive film in the memory cell area by using the etching mask for the double-layers gate.

According to the above manufacturing method, the layered inorganic films with the double-layers structure are formed in advance on the second conductive film formed on the substrate, then only the single-layer inorganic film is left in the logic circuit area by etching the overlying inorganic film, then the etching masks which correspond to the gate patterns are formed by etching the inorganic films in the memory cell area and the logic circuit area respectively. Therefore, in the memory cell area in which the etching resistance is required for the etching mask because the to-be-etched layer is thick, the thick inorganic films with the double-layers structure consisting of the first inorganic film and the second inorganic film can be used as the etching mask in forming the gates. On the contrary, in the logic circuit area, the single-layer thin inorganic film consisting of only the first inorganic film can be used as the etching mask, and therefore the formation of the fine pattern can be formed with high precision.

Otherwise, the manufacturing method set forth in the following may be used. That is, a first gate insulating film, a first conductive film, and a second gate insulating film are layered in sequence on an overall area of a main surface of a substrate, and then the first gate insulating film, the first conductive film, and the second gate insulating film in a logic circuit area are removed by etching. Then, a third gate insulating film is formed on an exposed surface of the substrate in the logic circuit area. Then, a second conductive film is formed on the overall area of the main surface of the substrate, and then a first inorganic film is formed on the second conductive film. After this, the first inorganic film in the logic circuit area is removed by etching, and then a second inorganic film is formed on the overall area of the main surface of the substrate. Then, an etching mask for the double-layers gate is formed by etching selectively the first inorganic film and the second inorganic film in a memory cell area. In contrast, an etching mask for the single-layer gate is formed by etching selectively the first inorganic film in the logic circuit area. The single-layer gate structure is formed by etching the first conductive film in the logic circuit area by using the etching mask for the single-layer gate, whereas the double-layers gate structure is formed by etching selectively the second conductive film, the second gate insulating film, and the first conductive film in the memory cell area by using the etching mask for the double-layers gate.

According to the above manufacturing method, the first inorganic film is formed on the second conductive film formed on the main surface of the substrate, then the first inorganic film in the logic circuit area is etched, and then the second inorganic film is formed again on the main surface of the substrate After this, the etching masks which correspond to the gate patterns are formed by etching the inorganic films in the memory cell area and the logic circuit area respectively. Therefore, the inorganic films with the double-layers structure, which has the etching resistance, can be used as the etching mask in the memory cell area in which the double-layers gate structure is to be formed. At the same time, the thin hard mask layer with the single-layer structure, which consists of only the first inorganic film, can be used as the etching mask in the logic circuit area in which the single-layer gate structure is to be formed, and therefore the fine pattern can be formed with high precision.

According to another aspect of the present invention, there is provided a semiconductor device having a nonvolatile memory with a double-layers gate structure and a logic circuit with a single-layer gate structure, comprising a double-layers gate which is patterned by using an etching mask consisting of a first insulating inorganic film and a second insulating inorganic film; and a single-layer gate which is patterned by using an etching mask consisting of one of the first insulating inorganic film and the second insulating inorganic film; wherein the etching mask used in patterning is left on respective gates.

According to such another aspect of the present invention, the semiconductor device which has the high precision fine pattern in the logic circuit forming area can be provided since the semiconductor device can be formed by the above semiconductor device manufacturing method. In addition, the step of removing the etching mask can be omitted by leaving the used etching mask as it is, and as a result the simplification of the process can be achieved.

BRIEF DESCRIPTION OF THE DRAWINGS

FIGS. 2A to 5L are sectional views showing respective steps of a method of manufacturing the semiconductor device according to the first embodiment of the present invention;

FIGS. 6A to 8I are sectional views showing respective steps of a method of manufacturing a semiconductor device according to a second embodiment of the present invention;

FIGS. 13A to 14H are sectional views showing a method of manufacturing a semiconductor device having the EEPROM with the double-layers gate structure and the CMOS logic circuit with the single-layer gate structure in the prior art.

DESCRIPTION OF THE PREFERRED EMBODIMENTS

Embodiments of the present invention will be explained in detail with reference to the accompanying drawings hereinafter.

(First Embodiment)

In a first embodiment, a structure of a semiconductor device and a method of manufacturing the same will be explained while taking a semiconductor chip applied for the IC card, etc. as an example.

Figure 1A:
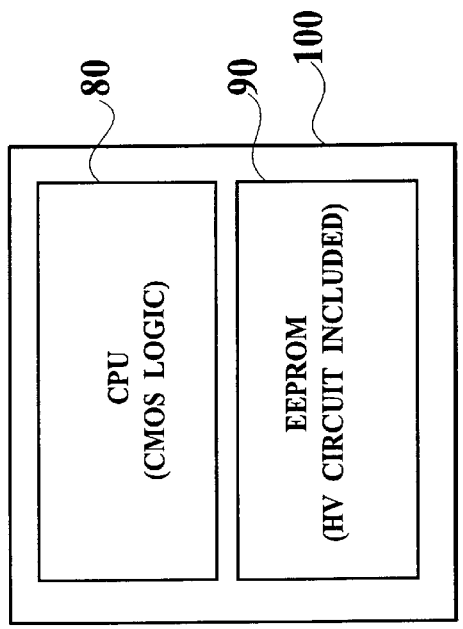
FIGS. 1A and 1B are a plan view and a sectional view showing a semiconductor device having an EEPROM with a double-layers gate structure and a CMOS logic circuit with a single-layer gate structure according to a first embodiment of the present invention respectively.

FIG. 1A is a plan view showing a structure of the semiconductor chip according to the first embodiment. As shown in FIG. 1A, a CPU area and an EEPROM area in which the nonvolatile memory is formed are formed on the semiconductor chip. The fine CMOS logic circuit pattern is formed in the CPU area, while the EEPROM, the HV circuit which generates a high voltage necessary for writing/erasing of the memory cell, etc. are formed in the EEPROM area.

Figure 1B:
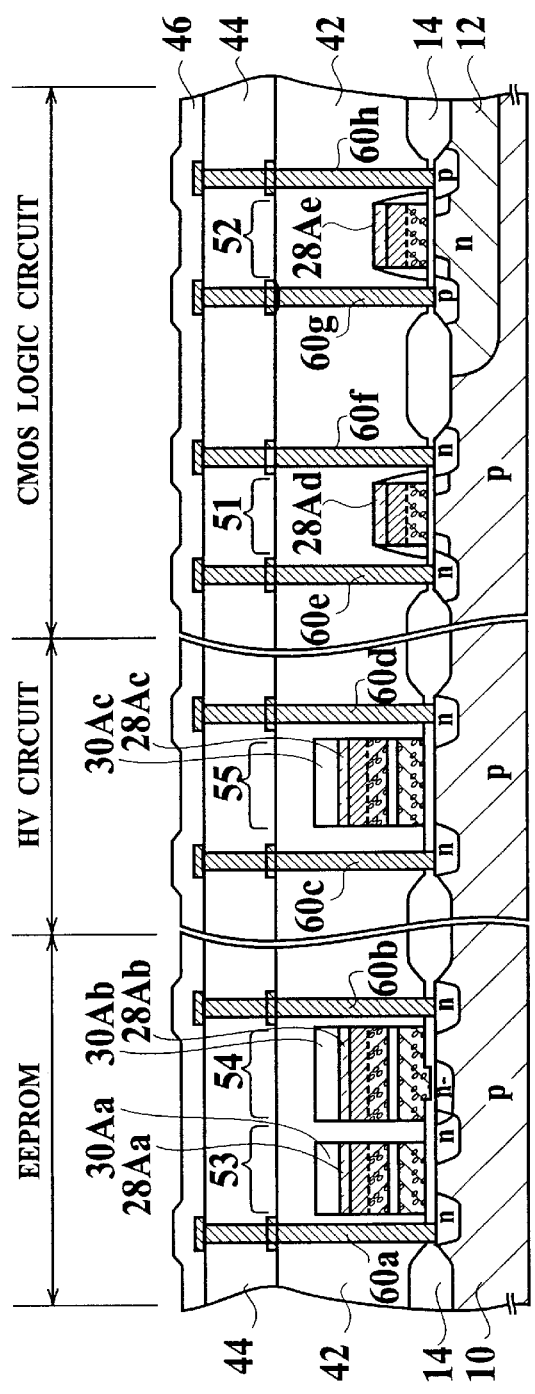

FIG. 1B is a sectional view showing the semiconductor device according to the first embodiment. The EEPROM has a double-layers gate structure and the CMOS logic circuit has a single-layer gate structure. The HV circuit is formed to have the double-layers gate structure like the EEPROM.

Figure 12:
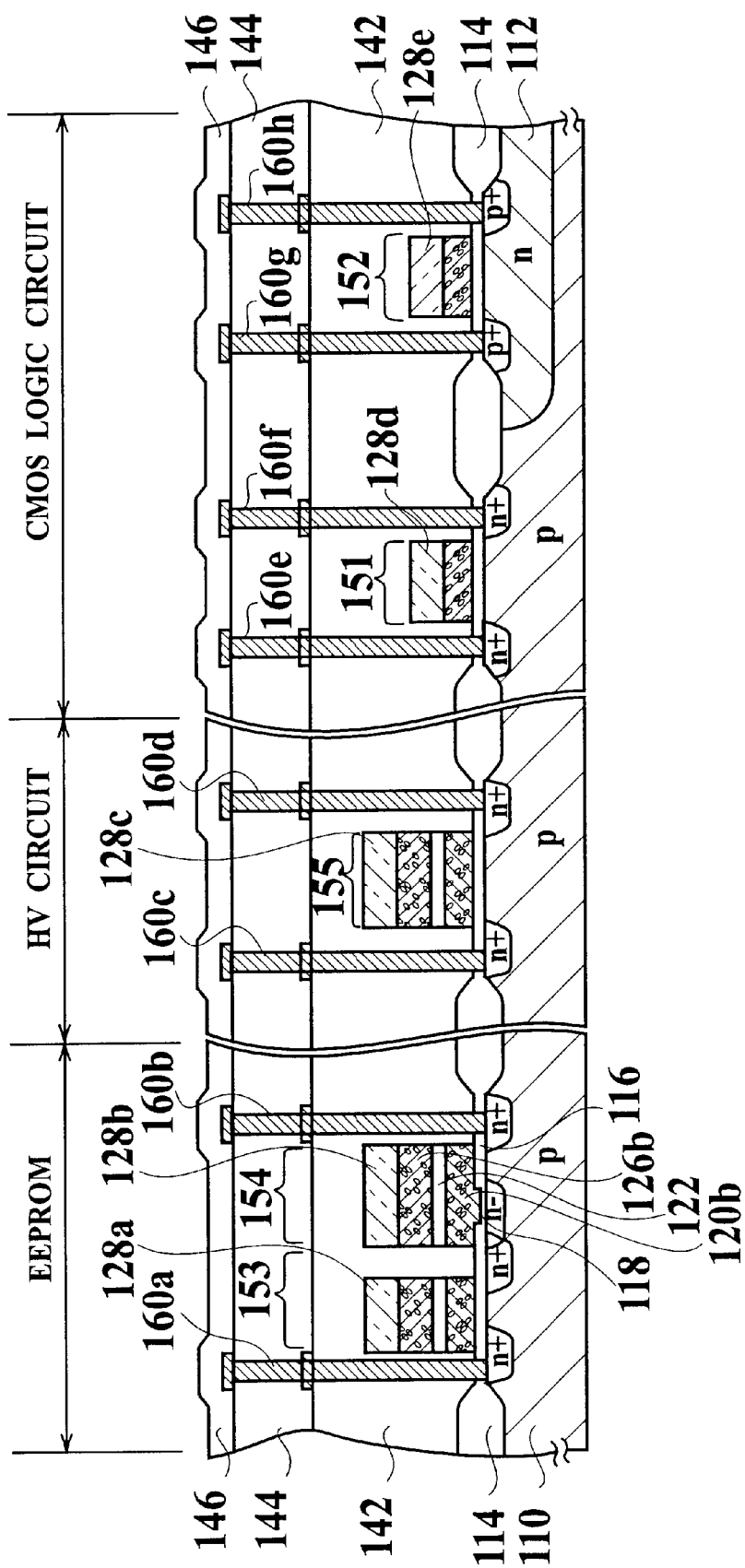
FIG. 12 is a sectional view showing a semiconductor device having of the EEPROM with the double-layers gate structure and the CMOS logic circuit with the single-layer gate structure in the prior art.

The basic sectional structure is common to the structure of the semiconductor device shown in FIG. 12 in the prior art, but a structure of the insulating hard mask which is left on uppermost layer gate electrodes of the gates 51 to 55 is different. More particularly, in the area of the EEPROM cell with the double-layers gate structure and the area of the HV Circuit as the peripheral circuit, the hard masks with the double-layers structure consisting of a silicon nitride (SiNx) film 28Aa and a silicon oxide (SiO2) films 30Aa, an SiNx film 28Ab and an SiO2 film 30Ab, and an SiNx film 28Ac and an SiO2 film 30Ac respectively are left on the overlying gate electrodes of the gates 53 to 55. In contrast, in the CMOS logic circuit area, the hard masks with the single-layer structure consisting of a SiNx film 28Ad and a SiNx film 28Ae respectively are left.

A main feature of the first embodiment resides in that first the hard mask used as the etching mask is formed previously as the double-layers structure in forming the gate pattern, then the hard mask can be used still as the double-layers structure in the EEPROM area in which the thick hard mask is needed for the etching process Then, the hard mask with the single-layer structure, which is derived by etching one layer from the double-layers hard mask, can be used in the CMOS logic circuit area in which the thin hard mask must be formed to form the fine pattern. Accordingly, since the thin hard mask which mates with the pattern precision required in forming the gate pattern can be used in the CMOS logic circuit area, the fine pattern can be formed with the high precision.

A method of manufacturing the semiconductor device according to the first embodiment will be explained in detail with reference to FIG. 2A to FIG. 5L hereunder.

First, as shown in FIG. 2A, an n well 12 is formed in the CMOS logic circuit area on a p-type semiconductor substrate 10 by using the ordinary method. In forming the a well 12, first an SiO2 film of about 1000 Å thickness is formed on a surface of the substrate, and then a resist pattern is formed on the SiO2 film by the photolithography step. Then, an n-type impurity ion such as phosphorus (P), etc. is implanted while using the resist pattern as an implantation mask, then the resist is removed, and then a resultant structure is thermally annealed at about 1200° C., whereby the n well 12 is formed. In this case, an example in which only the n well 12 is formed is shown in FIG. 12, a p well may be formed by the similar steps, as occasion demands.

Then, a field oxide film 14 is formed to provide the device isolation of respective circuit areas. In more detail, first the SiNx film is formed on the SiO2 film formed on the substrate, then the SiNx film is selectively etched by using the photolithography step to expose partially the SiO2 film, and then the field oxide film 14 of about 6000 Å thickness is formed by thermally oxidizing the exposed SiO2 film. The SiNx film and the SiO2 film which are left on the substrate are removed by the etching.

Here, the SiO2 film is formed again on the substrate, then the resist pattern serving as the ion-implantation mask is formed thereon, and then the n-type impurity is ion-implanted into the substrate via the SiO2 film. Thus, a tunnel impurity diffusion area is previously formed in the EEPROM area. Although not shown, the n-type impurity is lightly implanted into the channel area in the HV circuit area to adjust the threshold value.

The resist film and the SiO2 film on the substrate are removed, and then an SiO2 film 16 of about 350 Å thickness is formed on the surface of the substrate. This SiO2 film 16 constitutes a first gate oxide film of the double-layers gate structure.

In turn, the SiO2 film 16 in a part of the memory transistor area of the EEPROM is removed by the etching, and then a tunnel oxide film 18 of about 90 Å thickness is formed therein.

Then, as shown in FIG. 2B, a first polysilicon film 20 of about 2000 Å thickness is formed on an overall surface of the substrate by using the low pressure CVD method. This film acts as a film which constitutes the underlying gate electrode of the double-layers gate. Phosphorus (P) is doped into this film to reduce the resistance value, if necessary.

Then, a so-called ONO (oxide/nitride/oxide) film 22 serving as an interlayer gate insulating film is formed on the first polysilicon film 20. This ONO film 22 is constructed by three layers, i.e., the SiO2 film which is formed by thermally oxidizing a surface of the first polysilicon film 20, the SiNx film which is formed by the CVD method, and the SiO2 film which is formed by thermally oxidizing a surface of the SiNx film. A total thickness of these three layers is set to about 300 Å.

Then, as shown in FIG. 2C, the ONO film 22, the first polysilicon film 20, and the gate oxide film 16 located in the CMOS logic circuit area in which the single-layer gate structure is formed are removed by the etching.

Then, although not shown particularly, ions are implanted into the channel area of the CMOS logic circuit by the same manner as that applied to the HV circuit area in the previous step to control the threshold value. In other words, the p-type impurity is lightly ion-implanted into the p channel area and the n-type impurity is lightly ion-implanted into the n channel area.

Then, a thin SiO2 film 24 of about 90 Å thickness is formed in the CMOS logic circuit area so as to match the size of the fine transistor to be formed in this area.

Then, as shown in FIG. 2D, a second polysilicon film 26 of about 2000 Å thickness is formed on an overall surface of the substrate by the low pressure CVD (LPCVD) method. Then, a tungsten silicide (WSi) film 27 of 2000 Å thickness is formed on the second polysilicon film 26 by the sputter method. Later, the second polysilicon film 26 and the WSi film 27 constitute the overlying gate electrode in the EEPROM as well as the gate electrode of the single-layer gate structure in the CMOS logic circuit. In this fashion, if the gate electrode having the so-called polycide structure in which the metal silicide layer is formed on the polysilicon layer is formed, the lower resistance value of the gate electrode can be achieved.

Then, as shown in FIG. 3E, the hard mask film consisting of overlying and underlying insulating films is formed on an overall surface of the substrate. At first, an SiNx film 28A is formed as the underlying hard mask film and then, an SiO2 film 30A is formed as the overlying hard mask film In this case, the underlying hard mask film is set to have a thickness suitable for the formation of the CMOS logic circuit, while the overlying hard mask film is set to have such a thickness that a total thickness of the double-layers hard mask film consisting of the underlying hard mask film and the overlying hard mask film is suitable for the formation of the EEPROM cell. For example, if the fine gate pattern of about 0.3 $\mu$m width is to be formed in the CMOS logic circuit area, it is preferable that a thickness of the underlying hard mask should be set to less than about 1000 Å. Also, if the double-layers gate having an about 1 $\mu$m width and an about 4000 to 5000 Å height is to be formed in the EEPROM area, it is preferable that a total thickness of the underlying hard mask and the overlying hard mask should be set to more than about 2000 Å. Here, if the material having the higher etching resistance is used, the thinner film thickness may be adopted.

Then, as shown in FIG. 3F, the SiO2 film 30A acting as the overlying hard mask film, which is formed in the CMOS logic circuit area, is removed by the etching using the RIE (Reactive Ion Etching) method.

Here, since the SiO2 film is used as the overlying hard mask and the SiNx film is used as the underlying hard mask, a selective etching ratio of the overlying hard mask to the underlying hard mask is large. Therefore, the etching of the overlying hard mask only can be relatively easily carried out.

Then, as shown in FIG. 3G, with the use of the photolithography step, resist patterns 32a to 32c which correspond to respective gate patterns are formed in the EEPROM area and the HV circuit area, while the CMOS logic circuit area is covered with resist 32d. In this state, the dry etching of the hard mask films is carried out by the RIE method while using respective resist patterns as the etching mask. In this way, the hard mask patterns 30Aa and 28Aa, 30Ab and 28Ab, 30Ac and 28Ac, each has the double-layers structure, are formed in the area where the double-layers gate is to be formed. After this, used resists are removed.

At this time, as shown in FIG. 4H, with the use of the photolithography step, the EEPROM area and the HV circuit area are covered with resist 34a and resist patterns 34b, 34c corresponding to the gate pattern are formed in the CMOS logic circuit area. Then, single-layer hard mask patterns 28Ad and 28Ae, each is formed of only a single-layer of the SiNx film, are formed by dry-etching the SiNx film 28A while using the resist patterns 34b, 34c as the etching mask Here, in order to improve the pattern precision much more, the double-layers hard mask and the single-layer hard mask are patterned independently by the separate steps respectively. But they may be patterned by the same step.

Then, as shown in FIG. 4I, while using the double-layers hard mask patterns 28Aa and 30Aa, 28Ab and 30Ab, and 28Ac and 30Ac as the etching mask in the EEPROM area and the HV Circuit area and while using the single-layer hard mask patterns 28Ad, 28Ae as the etching mask in the CMOS logic circuit area respectively, the dry etching of the polycide layers consisting of the second polysilicon layer 26 (26A) and the WSi film 27 (27A) is executed simultaneously. In other words, in the CMOS logic circuit area, the single-layer gates 51, 52 are formed by using the thin hard mask patterns 28Ad, 28Ac.

Then, as shown in FIG. 4J, the CMOS logic circuit area is covered with a resist film 36. Then, in the EEPROM area and the HV circuit area, the interlayer gate insulating film 22 and the first polysilicon layer 20 are etched by carrying on the dry etching using the double-layers hard mask patterns. Finally, the double-layers gates 53, 54, 55 are formed. Then, the resist film 36 covering the CMOS logic circuit area is removed.

Then, as shown in FIG. 5K, the ion implantation is performed by using the formed gates 51 to 55 as the ion-implantation mask. Then, n-type impurity diffusion areas 40a to 40g and p-type impurity diffusion areas 41a, 41b, which constitute the source/drain regions of respective transistors, are formed via the annealing step.

In this case, it is preferable that the transistors located in the CMOS logic circuit area should be formed to have an LDD (Lightly Doped Drain) structure in which, as shown in FIG. 5K, implanted areas with a low impurity concentration are formed on the inside of the source/drain regions. In order to form the LDD structure, shallow ion implantation is executed once by using the gate patterns as the implantation mask, then sidewalls 38 made of the SiO2 film are formed on the side walls of the gates 51, 52, and then deep ion implantation of the high concentration impurity is executed once again by using the gates 51, 52 and the sidewalls 38 as the implantation mask.

Then, as shown in FIG. 5L, a BPSG (Borophosilicate Glass) film serving as an interlayer insulating layer 42 is formed on an overall area of the surface of the substrate. All the SiNx films used as the etching mask are still left on the uppermost layers of the gate electrodes of the gates 51 to 55. In this case, since the remaining hard masks are formed of an insulating film, they can constitute a part of the interlayer insulating layer 42. Thus, they are not removed and can be left as they are after the steps have been finished.

Succeeding steps will be explained with reference to FIG. 1 hereunder. In order to extend electrodes from the source/drain areas, contact holes are formed in the interlayer insulating layer 42, then wiring material such as tungsten (W), etc. is filled into the contact holes, and then the surface is planarized by using the CMP (Chemical Mechanical Polishing) step. Then, an interlayer insulating layer 44 is formed by the BPSG film and thus a multi-layers wiring layer is formed by the similar procedures. Finally, a passivation film 46 is formed on a surface of the device to protect the surface of the device.

In this manner, the thick hard mask with the double-layers structure, which has the necessary and sufficient etching resistance to form the double-layers gate, is used in the EEPROM area, while the thin hard mask with the single-layer structure, which is suitable for the formation of the fine pattern, in the CMOS logic circuit area. As a result, the double-layers gate and the single-layer gate can be formed with the appropriate pattern precision respectively without large additional steps.

(Second Embodiment)

FIG. 6A to FIG. 8I are sectional views showing respective steps of a method of manufacturing a semiconductor device having the EEPROM with the double-layers gate structure and the CMOS logic circuit with the single-layer gate structure according to a second embodiment of the present invention.

In the above first embodiment, an example has been explained wherein the hard mask with the double-layers structure consisting of the SiO2 film and the SiNx film is used as the hard mask used in forming the double-layers pattern. In this second embodiment, an example will be given hereunder wherein both hard masks with the double-layers structure are formed by the double-layers SiNx film.

The method of manufacturing a semiconductor device according to the second embodiment will be explained with reference to FIG. 6A to FIG. 8I hereinbelow.

Since respective steps from the steps of forming the well 12, which are explained with reference to FIG. 2A to FIG. 2D, to the steps of forming the polycide layers consisting of the second polysilicon layer 26 and the WSi film 27 on the entire surface of the substrate in the first embodiment are common in the second embodiment, their explanation will be omitted and thus succeeding steps will be explained hereunder.

Figures 6A, 6B, 6C, 6D:
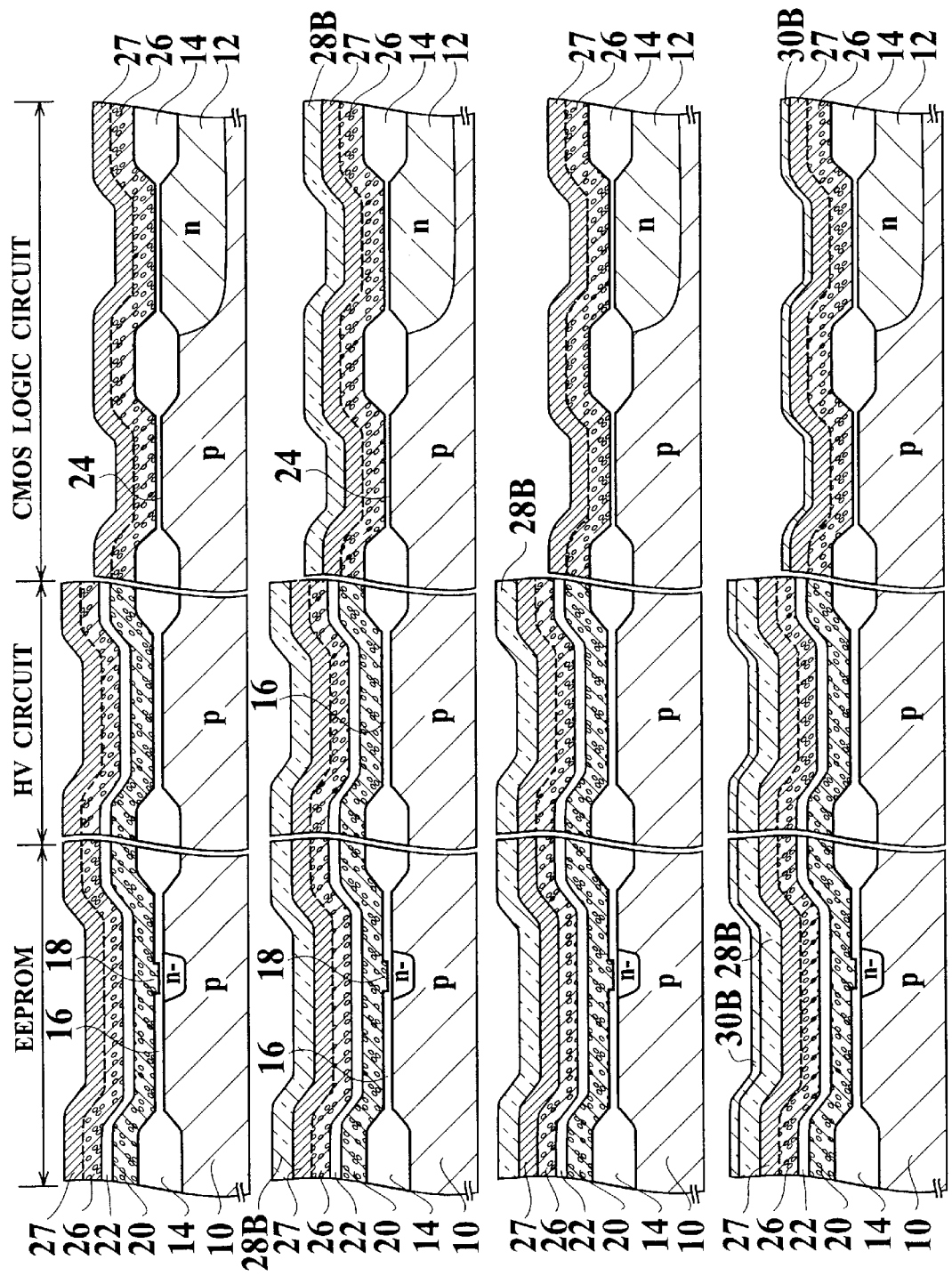

That is, as shown in FIG. 6A, in the CMOS logic circuit area, the n well 12 is formed on a necessary surface area of the p-type semiconductor substrate 10 and respective elements formed on the substrate are defined by the field oxide film 14. In the EEPROM area and the HV circuit area in which the double-layers gate structure is to be formed, the underlying gate oxide film 16 of about 350 Å thickness is formed On the surface of the substrate. The tunnel oxide film 18 of about 90 Å thickness is formed in a part of the EEPROM area. Then, the first polysilicon layer 20 acting as the underlying gate electrode, the interlayer gate insulating film 22, and the polycide layer consisting of the second polysilicon layer 26 and WSi film 27 are formed in sequence on the gate oxide film 16 and the tunnel oxide film 18. Meanwhile, in the CMOS logic Circuit area, the gate oxide film 16, the first polysilicon layer 20, and the interlayer gate insulating film 22 being formed once are removed by the etching, then the gate oxide film 24 of about 90 Å thickness is formed again on the surface of the substrate, and then the second polysilicon layer 26 and the WSi film 27 are formed.

Then, as shown in FIG. 6B, an SiNx film 28B is formed as the first layer of the hard mask on the overall surface of the substrate by the LPCVD method.

Then, as shown in FIG. 6C, the SiNx film 28B in the CMOS logic circuit area is removed by the etching using the RIE method.

Then, as shown in FIG. 6D, an SiNx film 30B is formed as the second layer of the hard mask on the overall area of the surface of the substrate.

Also, as shown in FIG. 6D, in the EEPROM area and the HV circuit area in which the double-layers gate structure is to be formed, the hard mask layer with the double-layers structure consisting of the first-layer SiNx film 28B and the second-layer SiNx film 30B is formed. In the CMOS logic circuit area, the hard mask layer consisting (if only the second-layer SiNx film 30B is formed.

For example, if the fine gate pattern of about 0.3 μm width is formed in the CMOS logic circuit area, it is preferable that a thickness of the second-layer SiNx film 30B should be set to less than about 1000 Å. If the double-layers gate having an about 1 μm width and an about 4000 to 5000 Å height is formed in the EEPROM area, it is preferable that a total thickness of the first-layer SiNx film 28B and the second-layer SiNx film 30B should be set to more than about 2000 μ. If material having the higher etching resistance is used, this thickness can be reduced further more.

Figure 7E:
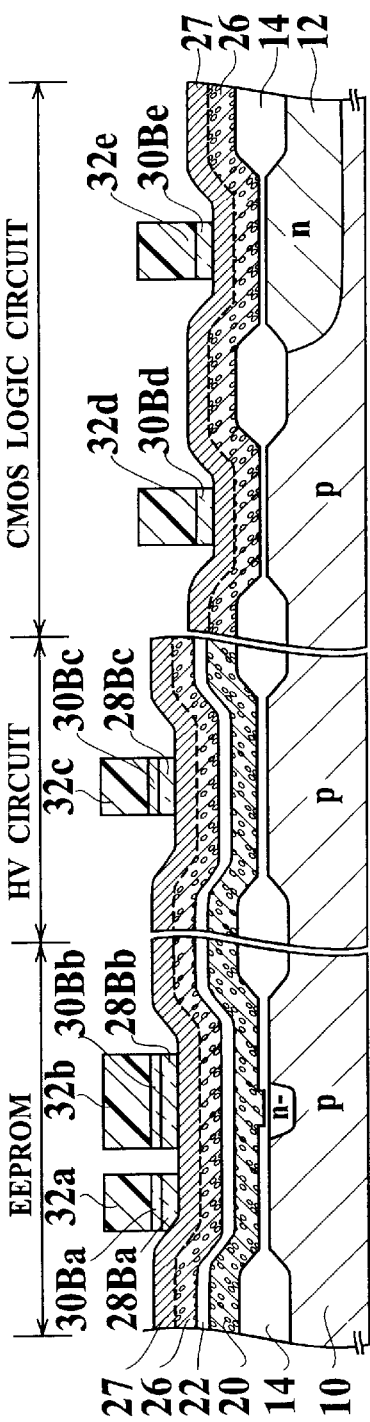

Then, as shown in FIG. 7E, resist patterns 32a to 32e which correspond to the gate patterns are formed on the substrate, and then the hard mask patterns 30Ba and 28Ba, 30Bb and 28Bb, and 30Bc and 28Bc are formed by carrying out the dry etching using the resist patterns as the etching mask. Then, such used resist is removed. Here the masks are patterned by the same step, but the double-layers hard mask and the single-layer hard mask may be patterned separately.

Figure 7F:
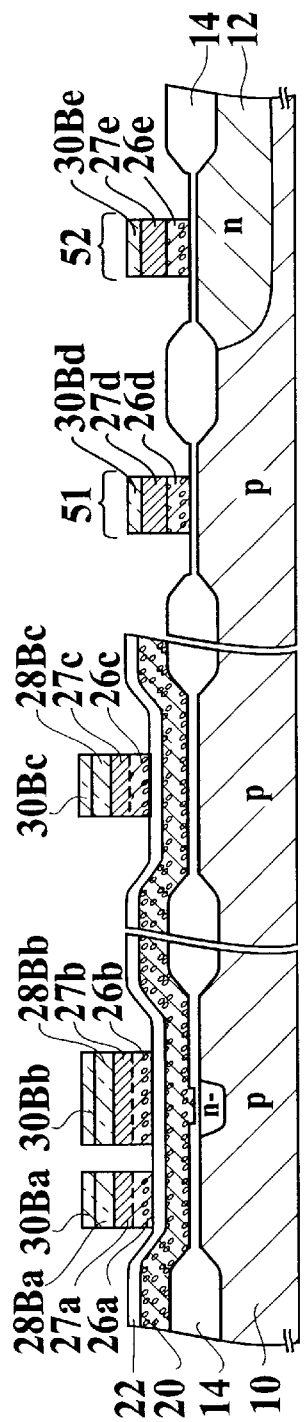

Then, as shown in FIG. 7F, while using the etching mask formed of the double-layers hard masks in the EEPROM area and the HV circuit area and while using the etching mask formed of the single-layer hard masks in the CMOS logic circuit area respectively, the dry etching of the polycide layers consisting of the second polysilicon layer 26 and the WSi film 27 is executed simultaneously. According to this step, the single-layer gates 51, 52 having the fine gate electrode pattern of about 0.3 μm width are formed in the CMOS logic circuit area. While, the polycide layers (26, 27) are etched in the EEPROM area and the HV circuit area and thus a surface of the interlayer gate insulating film 22 is exposed around the gates.

Figure 7G:
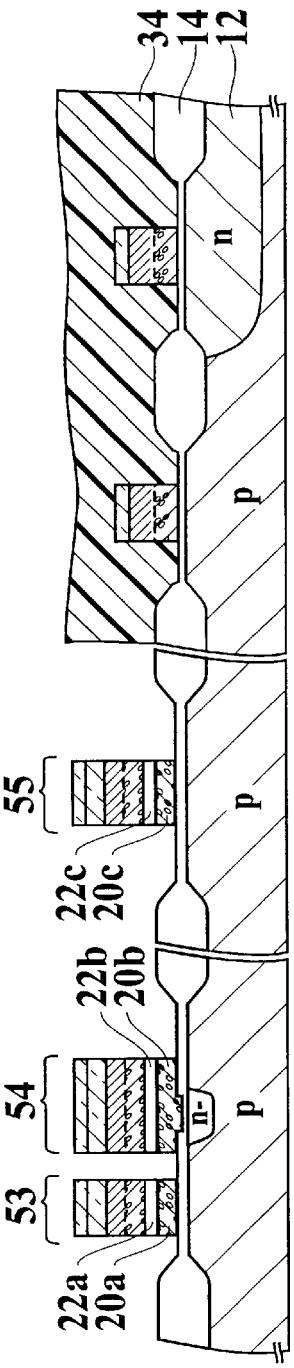

Then, as shown in FIG. 7G, the CMOS logic circuit area is covered with the resist film 34. In the EEPROM area and the HV circuit area, the interlayer gate insulating film 22 and the first polysilicon layer 20 are etched by using the double-layers hard mask patterns as the etching mask. Finally, the double-layers gates 53, 54, 55 can be formed After this, the resist film 34 covering the CMOS logic circuit area is removed.

Then, as shown in FIG. 8H, the ion implantation is performed by using the formed gates 51 to 55 as the ion-implantation mask. Then, the n-type impurity diffusion areas 40a to 40g and the p-type impurity diffusion areas 41a, 41b are formed via the annealing step. These areas constitute the source/drain regions of respective transistors. In this case, it is preferable that the transistors located in the CMOS logic circuit area should be formed to have the LDD structure in which, as shown in FIG. 8H, the implanted areas with a low impurity concentration are formed on the inside of the source/drain regions, If the LDD structure is formed, the shallow ion implantation is executed once by using the gate patterns as the implantation mask, then sidewalls 38 made of the SiO2 film are formed on the side walls of the gates 51, 52, and then the deep ion implantation of the high concentration impurity is executed once again by using the gates 51, 52 and the sidewalls 38 as the implantation mask.

Then, as shown in FIG. 8I, the BPSG film acting as the interlayer insulating layer 42 is formed on an overall surface of the substrate. All the SiNx films used as the etching mask are still left on the uppermost layers of the gate electrodes of the gates 51 to 55. In this case, all the SiNx films used as the etching mask are left as they are on the uppermost layers of the gate electrodes of the gates 51 to 55, Since remaining hard masks are formed of the insulating film, they can constitute a part of the interlayer insulating layer 42.

After this, in order to extend the electrodes from the source/ drain areas, the contact holes are formed in the interlayer insulating layer 42, then wiring material such as tungsten (W), etc. is filled into the contact holes. Then, the surface of the BPSG film is planarized by using the CMP step, and then the interlayer insulating layer 44 is formed by the BPSG film. The necessary wiring layer is formed by repeating the burying step. Finally, the passivation film 46 is formed on the surface of the device to protect the surface of the device.

In this way, in the second embodiment, the first-layer hard mask layer is formed on the entire surface of the substrate, then the first-layer hard mask layer located in the CMOS logic circuit area is removed by the etching, and then the second-layer hard mask layer is formed once again on the entire surface of the substrate. Therefore, like the case in the first embodiment, the thick hard mask with the double-layers structure which has the necessary and sufficient etching resistance to form the double-layers gate can be formed in the EEPROM area. On the other hand, the thin hard mask with the single-layer structure suitable for the formation of the fine pattern can be formed in the CMOS logic circuit area. As a result, the semiconductor device having the double-layers gate and the single-layer gate with the necessary precision can be manufactured.

In addition, according to the manufacturing method in the second embodiment, mask material can be selected as the hard mask layer without regard to the selective etching ratio between the first-layer material and the second-layer material particularly.

(Third Embodiment)

Figure 9:
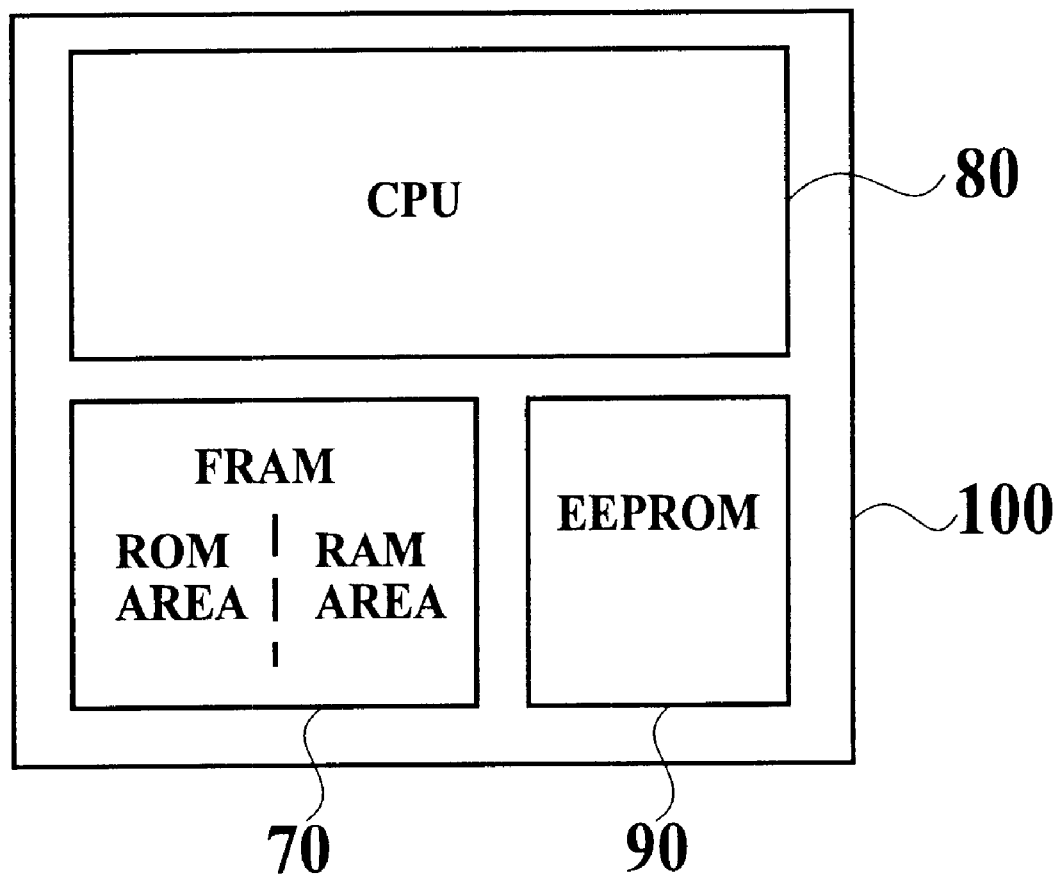
FIG. 9 is a plan view showing a semiconductor device having an EEPROM, a CMOS logic circuit, and an FRAM according to a third embodiment of the present invention.

FIG. 9 is a plan view showing a semiconductor device according to a third embodiment of the present invention. In the first and second embodiments, examples have been explained wherein the CPU area and the EEPROM area for the nonvolatile memory are formed on the semiconductor chip. In this third embodiment, an FRAM (Ferroelectic RAM) 70 and the EEPROM 90 are installed as the memory on the semiconductor chip.

Figure 10:
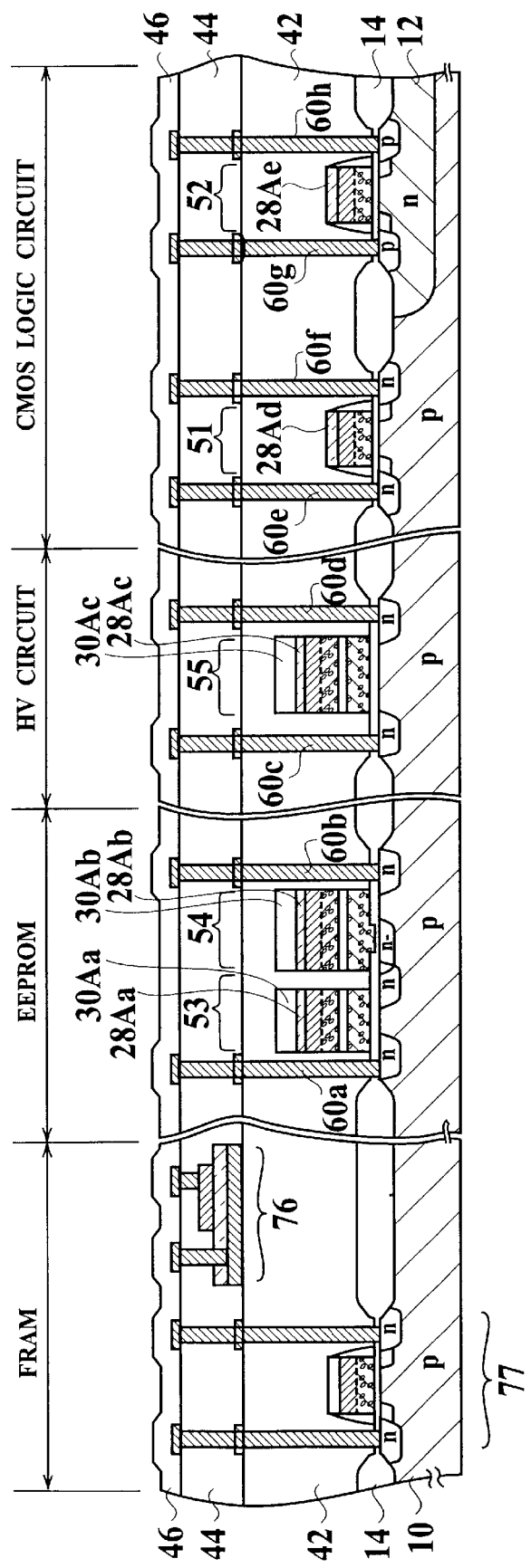
FIG. 10 is a sectional view showing the semiconductor device according to the third embodiment of the present invention.

FIG. 10 is a sectional view showing the semiconductor device according to the third embodiment. Respective structures of the EEPROM, the HV circuit, and the CMOS logic circuit are similar to those in the first embodiment. Here, a structure of the FRAM is added.

The FRAM is a memory which includes a capacitor using ferroelectric material. As shown in FIG. 10, a basic structure of the FRAM is identical to the DRAM, and consists of a MOS transistor 77 with the single-layer gate structure and a capacitor 76. In this case, ferroelectric material is used as dielectric material of the capacitor. Therefore, the FRAM can achieve the rapid programming, and also the FRAM can have a function as the RAM of a small consumed power as well as a function as the nonvolatile memory (ROM) since it can hold the stored data after the power supply has been turned off.

In this manner, since the FRAM has both the function as the ROM and the function as the RAM, the memory on the semiconductor chip can be constructed only by the FRAM. For this reason, recently the development of the IC card chip consisting of the FRAM area and the CPU area is advanced.

However, because the reading operation of the FRAM is the destructive read-out like the DRAM, there is such a problem that data deformation of the ROM is caused if the failure such as the turn-off of the power supply, etc. is generated during the reading of the data of the ROM portion. Such failure will cause the serious problem in use on the chip such as the IC card of which the high reliability of the information security is requested especially.

Therefore, in a chip 100 according to the third embodiment, all memories are not replaced with the FRAM 70, but a part of the EEPROMs 90 is left together with the FRAM 70.

The EEPROM is such a memory that it can perform the reading operation by the voltage at the same level as the normal transistor operating voltage, but it needs the high voltage such as about 10 to 15 V in the writing operation. Hence, even if the failure such as the cut-off of the power supply, etc. is caused in reading, there is no possibility that the problem of destroying the data, etc. occurs.

As shown in FIG. 9, if the EEPROM 90 together with the FRAM 70 is installed in the memory portion, the identification information such as the name, the ID code, etc. of which the high security is requested can be stored in the EEPROM, and remaining information can be stored in the FRAM. Thus, the semiconductor chip which has both the safety and the function can be provided.

Like the semiconductor chip according to the first and second embodiments, the FRAM and the CMOS logic circuit both having the single-layer gate structure and the EEPROM having the double-layers gate structure are installed together into the semiconductor chip 100 according to the third embodiment which includes the FRAM 70, the EEPROM 90, and the CPU 80. Therefore, the manufacturing method similar to those in the first and second embodiments may be used.

FIG. 11A to FIG. 11D are sectional views showing respective steps of a method of manufacturing the FRAM installed in this semiconductor chip.

Figure 11A:
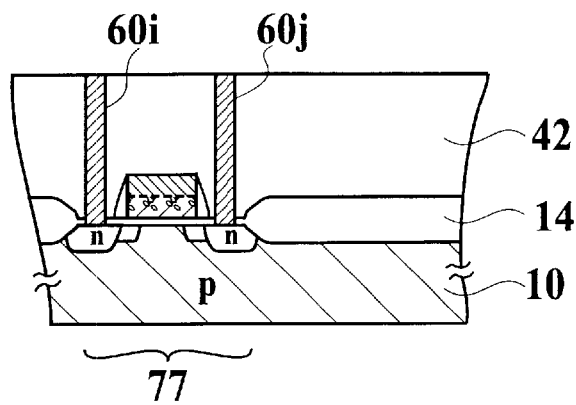
FIGS. 11A to 11D are sectional views showing respective steps of a method of manufacturing the FRAM according to the third embodiment of the present invention.

As shown in FIG. 11A, a MOS transistor 77 is formed on the semiconductor substrate, then the interlayer insulating film 42 is formed thereon, then the necessary contact holes are opened in the interlayer insulating film 42, then the wiring material is filed in the contact holes, and then a surface of the resultant structure is planarized by the CMP step.

Since the transistor including the FRAM has the same single-layer gate structure as the CMOS logic circuit, such transistor can be fabricated by using the same steps as those used for the CMOS logic circuit. That is, for example, the manufacturing method in the first embodiment shown in FIG. 2A to FIG. 5L can be used.

Figure 11B:
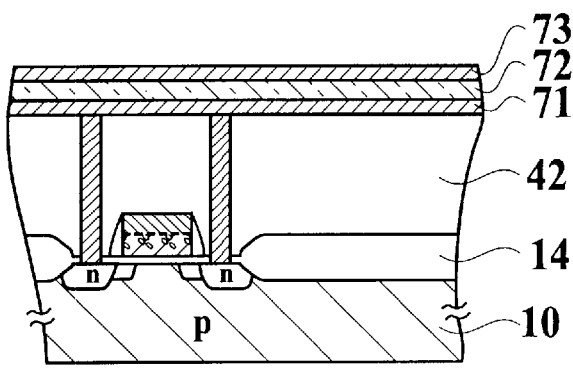

After this, as shown in FIG. 11B, a lower electrode 71 formed of a platinum (Pt) film is formed on the surface by using the sputter method, etc. Then, a ferroelectric material 72 such as lead zirconium titanate (PbZrTiO3), etc. having a perovskite crystal structure, for example, is formed thereon by using the sputter method, etc. Then, an upper electrode 73 formed of the Pt film is formed thereon by also using the sputter method, etc.

Figure 11C:
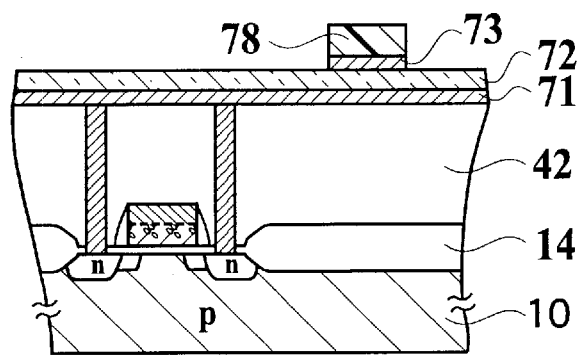
Figure 11D:
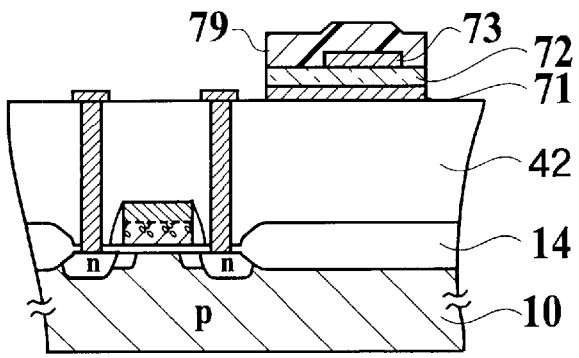

Then, as shown in FIG. 11C, the upper electrode 73 is patterned while using a resist pattern 78 as the etching mask. Then, as shown in FIG. 11D, a resist pattern 79 is formed, then the ferroelectric material 72 and the lower electrode 71 are patterned by using this resist pattern 79 as the etching mask, whereby a ferroelectric capacitor is formed.

As shown in FIG. 10, the capacitor portion is covered with the interlayer insulating film 44, then the necessary contact holes are opened, and then necessary leading electrodes are extended from the lower electrode 71 and the upper electrode 73 by filling the wiring material in the contact holes.

As the ferroelectric material constituting the capacitor portion of the FRAM, not only the above PbZrTiO3 but also SBT (SrBi2Ta2O9), etc. may be usable.

Also, as the memory installed together with the FRAM into the semiconductor chip, not only the EEPROM but also the nonvolatile memory such as EPROM, flash memory, etc. may be used.

The first, the second and the third embodiments of the present invention have been explained, but the present invention is not limited to the above embodiments. For example, as the double-layers gate structure of the memory transistor formed in the EEPROM area, the memory transistor having not only the structure in which the tunnel oxide film is formed only in the partial area of the memory transistor, like the structure shown in FIG. 1, but also the structure in which the tunnel oxide film is formed in the overall area may be used. If the nonvolatile memory has any double-layers gate structure, such structure is not limited.

In these embodiments, a pan of the gate electrode is formed of the polycide. But the gate electrode may be composed of only the polysilicon, and also it may be composed of other conductive material.

The semiconductor device manufacturing method explained in these embodiments are effective in forming the semiconductor chip having the single-layer gate structure and the double-layers gate structure. In particular, like the semiconductor chip installed in the IC card, such method is effective for the case where the fine pattern is required for the logic circuit.

In this case, if there is no need that the single-layer gate structure must be formed in the CMOS logic circuit area because of desired pattern size, etc., the double-layers hard mask structure may be used as it is in the CMOS logic circuit area without the etching of the mask layer. In this case, the double-layers gate structure may be formed by the steps similar to the EEPROM area in the CMOS logic circuit area.

What is claimed is:

1. A method of manufacturing a semiconductor device having a nonvolatile memory with a double-layers gate structure and a logic circuit with a single-layer gate structure, comprising the steps of:

patterning the double-layers gate by using an etching mask which consists of a plurality of layered inorganic films; and patterning the single-layer gate by using an etching mask which consists of any single-layer inorganic film of the plurality of layered inorganic films.

2. The method of claim 1, wherein the plurality of layered inorganic films include a first inorganic film and a second inorganic film, the first inorganic film is thinner than the second inorganic film, and the single-layer gate is patterned by using the etching mask which consists of the first inorganic film.

3. The method of claim 1, wherein the nonvolatile memory is an EEPROM.

4. The method of claim 1, further comprising the steps of:

laminating a first gate insulating film, a first conductive film, and a second gate insulating film in sequence on a main surface of a substrate;

removing the first gate insulating film, the first conductive film, and the second gate insulating film in a logic circuit area by etching;

forming a third gate insulating film on an exposed surface of the substrate in the logic circuit area;

forming a second conductive film on a top surface of the substrate;

forming layers of a first inorganic film and a second inorganic film on the second conductive film;

removing the second inorganic film in the logic circuit area by etching;

forming an etching mask for the double-layers gate by etching selectively the first inorganic film and the second inorganic film in a memory cell area;

forming an etching mask for the single-layer gate by etching selectively the first inorganic film in the logic circuit area;

forming the single-layer gate structure by etching the first conductive film in the logic circuit area by using the etching mask for the single-layer gate; and forming the double-layers gate structure by etching selectively the second conductive film, the second gate insulating film, and the first conductive film in the memory cell area by using the etching mask for the double-layers gate.

5. The method of claim 4, wherein the second inorganic film is having a high selective etching ratio to the first inorganic film.

6. The method of claim 5, wherein the first inorganic film contains silicon nitride as a major component, and the second film contains silicon oxide as a major component.

7. The method of claim 4, wherein the step of forming the second insulating gate film includes the steps of, forming an oxide film by thermally oxidizing a surface of the first conductive film, forming an SiNx film on the oxide film by using a CVD method, and forming another oxide film by thermally oxidizing a surface of the SiNx film.

8. The method of claim 1, further comprising the steps of:

forming a first gate insulating film, a first conductive film, and a second gate insulating film in sequence on a main surface of a substrate;

removing the first gate insulating film, the first conductive film, and the second gate insulating film in a logic circuit area by etching;

forming a third gate insulating film on an exposed surface of the substrate in the logic circuit area;

forming a second conductive film on the main surface of the substrate;

forming a first inorganic film on the second conductive film;

removing the first inorganic film in the logic circuit area by etching;

forming a second inorganic film on the main surface of the substrate;

patterning an etching mask for the double-layers gate by etching selectively the first inorganic film and the second inorganic film in a memory cell area;

forming an etching mask for the single-layer gate by etching selectively the first inorganic film in the logic circuit area;

forming the single-layer gate structure by etching the first conductive film in the logic circuit area by using the etching mask for the single-layer gate; and forming the double-layers gate structure by etching selectively the second conductive film, the second gate insulating film, and the first conductive film in the memory cell area by using the etching mask for the double-layers gate.

9. The method of claim 8, wherein same material is used as the first inorganic film and the second inorganic film.

10. The method of claim 9, wherein the first inorganic film and the second inorganic film contain silicon nitride as a major component.

11. The method of claim 8, wherein the step of forming the second insulating gate film includes the steps of, forming an oxide film by thermally oxidizing a surface of the first conductive film, forming an SiNx film on the oxide film by using a CVD method, and forming another oxide film by thermally oxidizing a surface of the SiNx film.

* * * * *